(12) United States Patent
Hedlund et al.

(10) Patent No.: US 6,516,282 B2
(45) Date of Patent: Feb. 4, 2003

(54) PREDICTIVE THERMAL CONTROL USED WITH A VACUUM ENCLOSED COIL ASSEMBLY OF A MAGNETIC RESONANCE IMAGING DEVICE

(75) Inventors: Carl R. Hedlund, Waterford, NY (US); Pierre R. Emeric, Milwaukee, WI (US)

(73) Assignee: GE Medical Systems Global Technology Company, Waukesha, WI (US)

( * ) Notice: Subject to any disclaimer, the term of this patent is extended or adjusted under 35 U.S.C. 154(b) by 0 days.

(21) Appl. No.: 09/681,514

(22) Filed: Apr. 19, 2001

(65) Prior Publication Data

US 2002/0156595 A1 Oct. 24, 2002

(51) Int. Cl.⁷ .............................................. G06F 15/00
(52) U.S. Cl. ........................................ 702/132; 355/53
(58) Field of Search .................... 702/132; 355/53; 324/322; 62/127; 128/653.2; 123/41.5

(56) References Cited

U.S. PATENT DOCUMENTS

| 4,639,672 A | | 1/1987 | Beaumont |
| 5,284,144 A | * | 2/1994 | Delannoy et al. ........ 128/653.2 |
| 5,296,810 A | | 3/1994 | Morich |
| 5,406,204 A | | 4/1995 | Morich et al. |
| 5,424,643 A | | 6/1995 | Morich et al. |
| 5,489,848 A | | 2/1996 | Furukawa |
| 5,746,061 A | * | 5/1998 | Kramer ........................ 62/127 |
| 5,793,210 A | | 8/1998 | Pla et al. |
| 6,043,653 A | | 3/2000 | Takamori et al. |
| 6,053,132 A | * | 4/2000 | Evans ........................ 123/41.5 |
| 2001/0019266 A1 | * | 9/2001 | Nerreter ..................... 324/322 |
| 2001/0055102 A1 | * | 12/2001 | Emoto ......................... 355/53 |

* cited by examiner

Primary Examiner—John S. Hilten
Assistant Examiner—Xiuqin Sun
(74) Attorney, Agent, or Firm—Ziolkowski Patent Solutions Group LLC; Michael A. Della Penna; Carl B. Horton

(57) ABSTRACT

The present invention provides a control used in conjunction with a vacuous chamber enclosing the gradient coils of an MRI apparatus to predict heat dissipation requirements to maintain internal and external temperatures below maximum operating limits thereby enabling higher power applications for faster-imaging with improved quality, as well as allowing longer scan times for interventional procedures. The control includes determining operating parameters of an imminent scan session and predicting therefrom maximum and minimum operating temperatures. The predicted maximum and minimum temperatures are compared to maximum and minimum temperatures required for proper operation of the MRI system. If necessary, the operating profile is adjusted to drive the predicted temperatures to satisfy the temperatures required by environmental and device guidelines.

29 Claims, 3 Drawing Sheets

PREDICTIVE THERMAL CONTROL USED WITH A VACUUM ENCLOSED COIL ASSEMBLY OF A MAGNETIC RESONANCE IMAGING DEVICE

BACKGROUND OF INVENTION

The present invention relates generally to magnetic resonance imaging (MRI), and more particularly, to a system and method to dissipate heat generated by predicting thermal generation based on a selected excitation of a coil assembly in an MRI apparatus and thereby maintain coil assembly temperature within acceptable operating limits.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$ may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

During patient scans, the gradient coils that produce the magnetic field gradients dissipate large amounts of heat, typically on the order of tens of kilowatts. The majority of this heat is generated by resistive heating of the copper electrical conductors that form the x, y, and z-axis gradient coils when these coils are energized. The amount of heat generated is in direct proportion to the electrical power supplied to the gradient coils. The large power dissipations not only result in increased temperature to the gradient coil, the heat produced is distributed within the gradient coil assembly, or resonance modules, and influences the temperature in two other critical regions. These two regions are located at the boundaries of the gradient assembly and include the patient bore surface and the warm bore surface adjacent to the cryostat that houses the magnets. Each of these three regions has specific maximum temperature limitations. In the resonance module, there are material temperature limitations, such as the glass transition temperature. That is, although the copper and fiber-reinforced backing of the coils can tolerate temperatures in excess of 120° C., the epoxy to bond the layers typically has a much lower maximum working temperature of approximately 70–100° C. On the patient bore surface, regulatory limits mandate a peak temperature on the patient bore surface of 41° C. The warm bore surface also has a maximum temperature that is limited to approximately 40° C. to prevent excessive heat transference through the warm bore surface and into the cryostat. Further, temperature changes of more than 20° C. can cause field homogeneity variations due to a temperature dependence of the field shim material that exhibits a magnetic property variation with temperature.

Typically, the heat produced by the gradient coils in the resonance modules is removed from the gradient assembly by liquid filled cooling tubes embedded in the resonance modules at a given distance from the heat conductors. A liquid coolant, such as water, ethylene, or a propylene glycol mixture, enters the resonance module at a fixed temperature and flow rate, absorbs heat from the gradient coils as it is pumped through the cooling tubes, and transports the heat to a remote heat exchanger/water chiller. Heat is then ejected to the atmosphere by way of the heat exchanger/chiller. For each degree reduction of the coolant temperature as it enters the resonance module, the peak temperatures at each of the three critical regions (resonance module interior, patient bore surface, and warm bore surface) are also lowered.

However, in current systems, the minimum temperature of the coolant supplied to the resonance modules is limited by the dew point temperature of the ambient air. That is, since it is necessary to prevent the water vapor in the air from condensing in the resonance modules in general, and on the gradient coils in particular, the temperature of the coolant must remain above the dew point temperature of the ambient air. The high voltages and currents that are applied to the gradient coils dictates an atmosphere that must be free of such condensation. Current environmental specifications for MR rooms require 75% relative humidity at 21° C., which requires a dew point temperature of 16° C. Therefore, the minimum coolant temperature must be above 16° C. under these conditions.

The maximum power which can be supplied to a resonance module is therefore limited by the external dew point temperature. To increase the power which can be received by the resonance module, it is necessary to lower the minimum coolant temperature. However, as indicated previously, environmental specifications limit the minimum coolant temperature to above 16° C. for an MR room with 75% relative humidity at 21° C. As a result, these current systems are unable to accommodate higher power patient scan sequences often required by resonance modules.

In these known systems, the lowest permissible coolant temperature is dictated by atmospheric conditions or the ambient dew point temperature. With these systems, the coolant temperature is set above the worst case dew point temperature based upon the given temperature and relative humidity specifications in the room housing the MR system.

Further, these systems must be kept from overheating. In case of increased temperatures of the resonance module or the patient surface, imaging scans must be interrupted or limited to low power sequences, which in turn reduces the efficiency and efficacy of the MR system. Time is then lost because imaging sessions cannot begin anew until the resonance module or patient surface cools sufficiently.

It would therefore be desirable to design a method and system to maintain gradient coil temperature within a specified range regardless of the selected excitation applied, thereby enabling higher power applications for faster imaging with improved image quality and longer scan times.

SUMMARY OF INVENTION

The present invention provides a predictive system and method overcoming the aforementioned drawbacks by removing heat from the gradient coil module of an imaging device based on the type of excitation applied while maintaining internal and external temperatures below maximum operating limits. Such a technique allows higher power applications for faster imaging with improved image quality, as well as, allowing longer scan times for interventional procedures.

A cooling system is provided to dissipate heat from an MRI resonance module. The cooling system includes a vacuum enclosure, a set of relative humidity, temperature and pressure sensors, and a control system that dynamically adjusts the temperature of coolant in cooling tubes embedded in the resonance module. The cooling fluid increases in temperature as it absorbs heat from the resonance module and transports the heat to a remote heat exchanger, such as, a water chiller. Since air and water vapor are removed from the vacuum enclosure containing the resonance module, condensation is prevented in the evacuated enclosure. As a result, the coolant temperature may be adjusted as needed to remove heat and maintain gradient coil temperatures within allowable levels.

Moreover, to further enhance proper operation and reliability, pressure and relative humidity sensors are placed in the vacuum enclosure to monitor for air and/or coolant leakage. To monitor condensation of water vapor on the exterior surfaces of the gradient coil, temperature sensors are installed on the patient and warm bore surfaces and in the vacuum enclosure. The control system is configured to provide the lowest practical coolant temperature while simultaneously preventing condensation on the patient and warm bore surfaces. Additionally, the relative humidity and pressure sensors may be used to trigger an alarm and disable the gradient coil drivers in response to an anomalous operating condition.

In accordance with one embodiment of the present invention, a method for cooling electrical coils in MRI device is provided. The method includes the step of determining a future thermal load for an electrical coil and determining an expected operating temperature range for the electrical coil based on the future thermal load. The expected operating temperature range is then compared to a device specification temperature range. If necessary, based on the comparison of the expected operating temperature range to the specification temperature range, cooling operating parameters are adjusted to drive the expected operating temperature range to be within the specification temperature range.

In another aspect of the present invention, a computer program is provided to maintain critical temperatures of an MRI system within acceptable limits. The computer program includes a set of instructions that when executed by a computer causes the computer to receive an imminent scan profile and predict a gradient thermal load required for the imminent scan profile. The set of instructions further causes the computer to determine a cooling profile to accommodate the gradient thermal load and to cool the MRI system according to the cooling profile.

In yet a further aspect of the present invention, an MRI apparatus is provided and includes a magnetic resonance imaging (MRI) system having a plurality of gradient coils. The gradient coils are configured to be positioned about a bore of a magnet to impress a polarizing magnetic field. The MRI system further includes an RF transceiver system and an RF switch controlled by a pulse module to transmit RF signals to an RF coil assembly to acquire MR images. The MRI apparatus also includes an input device to receive a selected scan sequence and a cooling system to dissipate heat from the plurality of gradient coils. The cooling system includes a temperature sensor positioned to sense an indication of gradient coil temperature and a set of coolant tubes having a coolant pass therethrough and in thermal contact to transfer heat from the gradient coils of the-MR system. A heat exchanger is connected to the coolant tubes to remove heat from the coolant. A control is connected to receive signals from the temperature sensor and send signals to the heat exchanger to control coolant temperature in response to the selected scan sequence.

In accordance with another aspect of the present invention, a predictive thermal control of an imaging device is provided. The thermal control includes an input to receive a user selected scan sequence and at least one temperature sensor positioned to sense an indication of gradient coil temperature of a gradient coil assembly of an imaging device. The control further includes a pressure sensor positioned to sense pressure of a vacuum enclosure housing the gradient coil assembly therein. A humidity sensor is also provided and positioned to sense relative humidity within the vacuum enclosure. The aforementioned sensors continuously provide feedback to a processor programmed to maintain device-operating temperature within a specification range, the processor is further programmed to determine a cooling profile based on the user selected scan sequence and, in response to the feedback, adjust the coolant profile on-the-fly to regulate proper cooling of the gradient coil assembly.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings.

DETAILED DESCRIPTION

Figure 1:
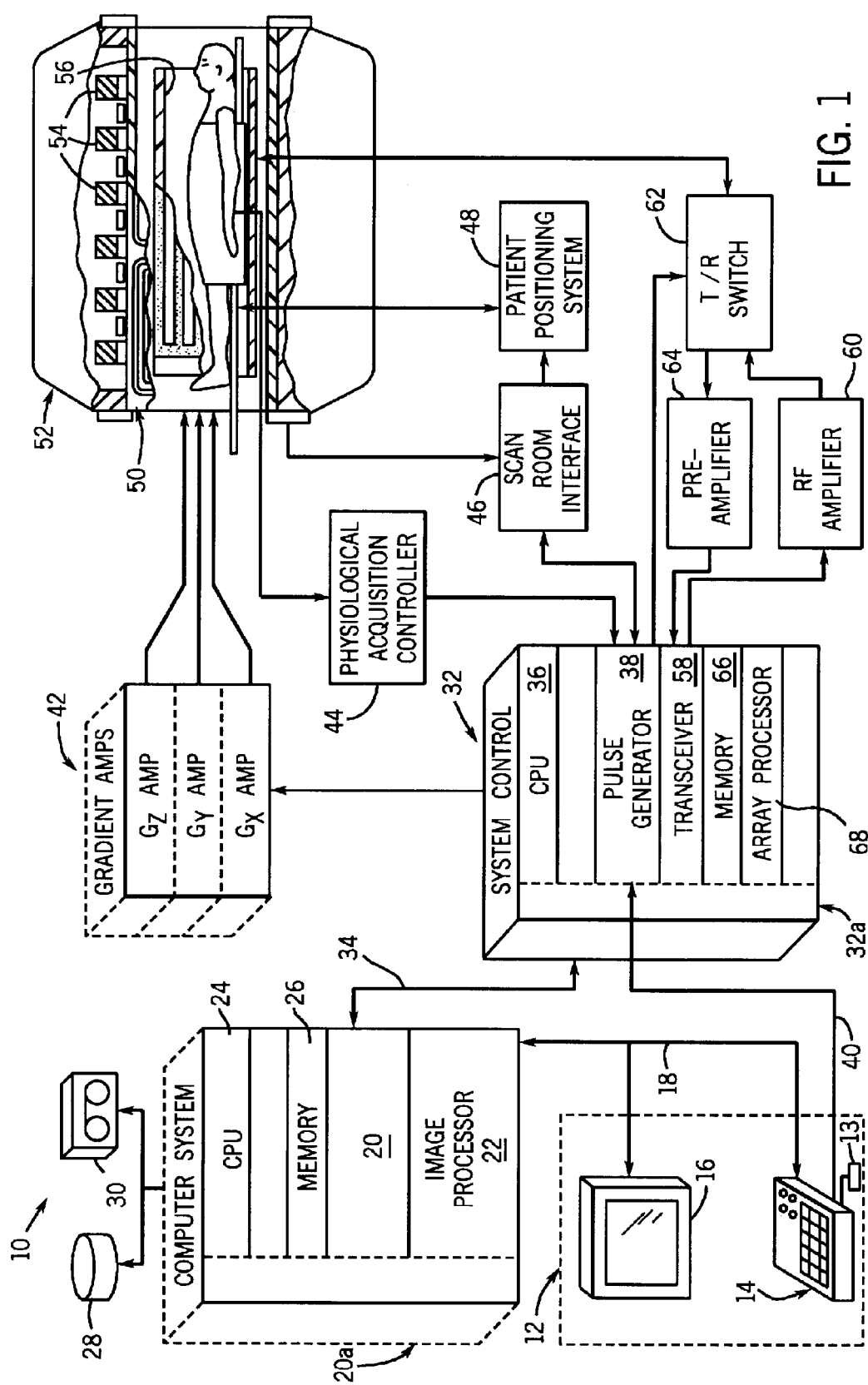
FIG. 1 is a schematic block diagram of an MRI imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by-the image processor 22 and conveyed to the operator console 12 and presented on the display 16.

The present invention provides a system and method to improve heat removal from the gradient coil housing, or resonance module, of an imaging device while maintaining internal and external temperatures below maximum operating limits, thereby enabling higher power applications for faster imaging with improved image quality as well as, allowing longer scan times for interventional procedures.

Figure 2:
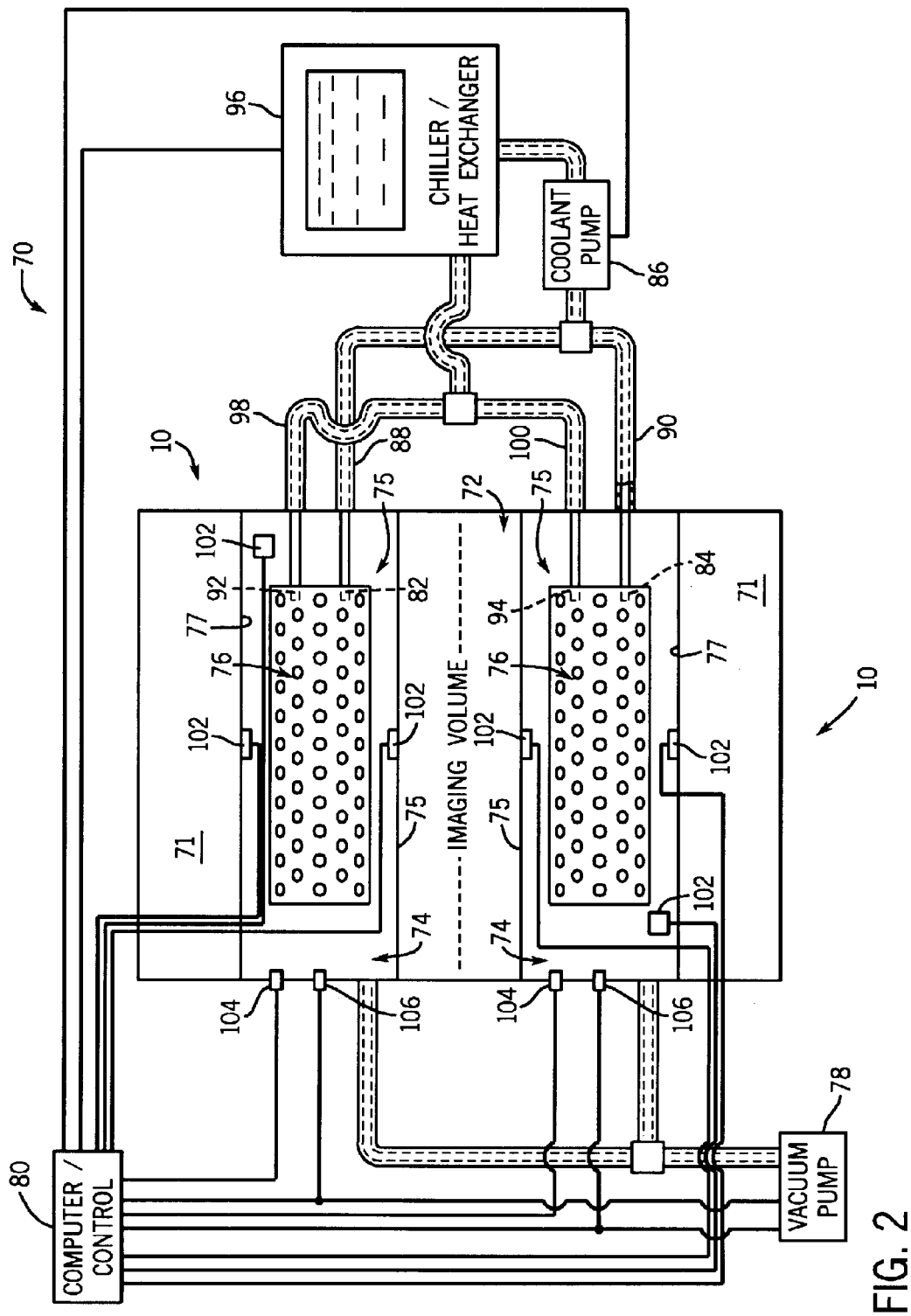
FIG. 2 is a schematic drawing of a cooling system for use with the MRI imaging system shown in FIG. 1.

Referring to FIG. 2, a cooling system 70 is provided and configured to reduce heat generated by the gradient coils of a magnetic resonance imaging (MRI) system 10. Dissipating heat generated within an MRI device 10 is paramount to avoid overheating and potential damage to the gradient coils. The MRI device 10 includes a cryogenic tank 71 to house the main magnet (not shown) and an imaging volume space 72 for a subject, such as, a medical patient, to be placed to undergo an imaging session. The imaging volume is defined by a vacuum pumped enclosure, or resonance module, 74 configured to house the gradient coils and the RF coils. As indicated previously, the gradient coils are excited by a corresponding gradient amplifier to produce magnetic field gradients used for spatially encoding signals acquired by the RF coils used to reconstruct an image in a known manner.

Further enclosed in vacuum chamber 74 are a number of cooling tubes 76 configured to circulate liquid coolant, such as water only, or a water-ethylene-glycol-mixture or a water-propylene-glycol mixture, to remove heat generated by the excitation of the gradient coils. When generating the magnetic field gradients, the gradient coils, as a result of the resistive effects of their copper composition, generate considerable heat, typically on the order of tens of kilowatts, which must be dissipated to ensure proper operation of the MRI system 10. To assist in heat dissipation, coolant is circulated through the cooling tubes 76 embedded in resonance module 74, as will be discussed shortly.

As indicated previously, resonance module 74 is maintained in a vacuous state. Enclosing resonance module 74 in a vacuum operates to expunge any air and water vapor accumulating in the resonance module. As is well known, circulating a liquid having a temperature less than the temperature of the surrounding environment may result in condensation forming in the resulting environment. That is, circulating coolant through tubes 76 to dissipate heat from the gradient coils in a non-vacuous chamber could result in condensation forming on the surface of the gradient coils if the coolant temperature is below the dew point in the chamber. Since condensation cannot be allowed to form on the surface of the gradient coils, preexisting cooling systems have maintained the temperature of the coolant above the dew point.

Maintaining a vacuous state within the enclosed vacuum chamber 74 eliminates the possibility of condensation on the gradient coils of the MR apparatus. The present invention provides a vacuum pump 78 in flow communication with each vacuum chamber 74. The vacuum pump is configured to frequently expunge any air and/or moisture in the vacuum chamber 74 by maintaining a vacuum condition of approximately $10^{-1}$ to $10^2$ torr. Vacuum pump 78 is controlled by a control system, such as a computer or controller 80 that is configured to control the operation of the vacuum pump 78. That is, computer/controller 80 may signal the vacuum pump to decrease or increase the pressure within the enclosure 74 or may shut-off vacuum pump 78 during down times of the MRI apparatus to increase the efficiency and longevity of the pump 78. For example, the computer/controller 80 may be programmed to shut-off the vacuum pump 78 at night when the MRI apparatus 10 is inactive.

Still referring to FIG. 2 and as indicated previously, condensation may form on the surface of the gradient coils in response to the circulation of coolant that is below the ambient dew point if not for a consistent vacuous state within chamber 74. Coolant enters the resonance module or chamber 74 via inlet ports 82 and 84. Coolant is fed to the resonance module 74 by a coolant pump 86 which is fluidly connected to inlet ports 82, 84 via external fluid lines 88 and 90. To assist in maintaining the desired coolant temperature, coolant lines 88 and 90 are sufficiently insulated to limit any variance in coolant temperature as it enters the vacuum pumped resonance module 74 and avoid condensation in non-vacuous areas. Although two inlet and outlet ports for the coolant are shown in FIG. 2, in other embodiments, there may be just one inlet and one outlet, since the cooling tubes 76 are circular around the imaging volume 72, or there may be more than two to provide more consistent flow circulation.

Coolant pump 86 circulates coolant at a temperature dependent on system needs and, in accordance with the present invention, at a coolant temperature independent of the dew point temperature of the ambient. By removing any moisture in the vacuum enclosure 74, the coolant may be input through ports 82 and 84 at any desired temperature. That is, the condensation effects resulting from the relationship between coolant temperature and the ambient temperature are negated by the evacuation of moisture from the vacuum enclosure 74 by the vacuum pump 78 and an appropriate control 80.

Coolant entering the resonance module 74 travels through cooling tubes 76 and while doing so absorbs heat from the coils. The coolant carrying the heat entrained therein away from the gradient coils exits the vacuous resonance module 74 through outlet ports 92 and 94 which transports the heated coolant to a chiller/heat exchanger 96 via return lines 98, 100. Chiller 96 is configured to dissipate heat absorbed in the coolant using a heat exchanger and a compressor (not shown) in a known technique and lower the coolant temperature to a desired temperature dictated by the computer/control 80.

Operation of chiller 96 is controlled by computer/control 80 to drive the temperature of the liquid coolant to a desired value. Regulation of the coolant temperature in accordance with the present invention allows for dynamic adjusting of the coolant temperature to keep the patient surface and other resonance module temperatures, such as, the warm bore surface temperature adjacent to the resonance module, within specified limits. That is, if the heat dissipation requirements increase, the temperature of the coolant may be decreased below the dew point temperature if necessary. Further, if the heat or power dissipation needs are reduced, the temperature of the coolant may be allowed to increase thereby decreasing the amount of energy exerted by the chiller 96. As a result, down times of the MRI apparatus 10 to allow the system to cool are avoided, and further, the MRI apparatus 10 may be implemented with applications and imaging sequences requiring higher power input to the gradient coils. A method to regulate the coolant temperature will be discussed with particular reference to FIG. 3.

Still referring to FIG. 2, a number of operation sensors are provided to monitor the temperature, pressure, and relative humidity of the vacuum enclosure 74 and various surfaces of the MR apparatus 10. Temperature sensors 102 are placed to measure the temperature of the resonance module 74, the patient surface 75 and the warm bore surface 77. Further, pressure and relative humidity sensors 104, 106 are positioned within the resonance module 74 to measure the vacuum pressure and condensation properties within the resonance module 74. The sensed relative humidity and pressure are transmitted to the computer/control 80 which in turn transmits control signals to vacuum pump 78 to increase or decrease the pressure in the resonance module 74. Temperature sensors 102 transmit temperature data of the resonance module 74, patient bore surface 75, and the warm bore surface 77. In response to the received temperature signals, computer 80 transmits control signals to chiller 96. As the temperature of the bore surfaces and the resonance module 74 increase, the computer/control 80 transmits instructions to the chiller 96 to adjust the temperature of the liquid coolant flowing to the resonance modules 74. Alternatively or in conjunction with temperature adjustment, as the need to dissipate heat from the gradient coils changes, the computer/control 80 may also adjust the flow rate of coolant pump 86 to increase or decrease temperatures in the MR device 10 to a desired temperature. Furthermore, the temperature, pressure, and relative humidity sensors 102, 104, 106 may also be implemented to trigger the computer/control 80 to disable the gradient coil drivers if an anomalous condition is detected.

Accordingly and in a further embodiment of the present invention, a predictive thermal control technique is provided to regulate the temperature of the resonance module within desired operating limits by determining a coolant inlet temperature and/or flow rate prior to, and in proportion with, the power requirements of an impending patient scan profile. By predicting the thermal load imposed on the MRI system by the anticipated patient scan sequence, the coolant inlet temperature profile may be adjusted to ensure that at least a temperature is maintained within acceptable limits.

Figure 3:
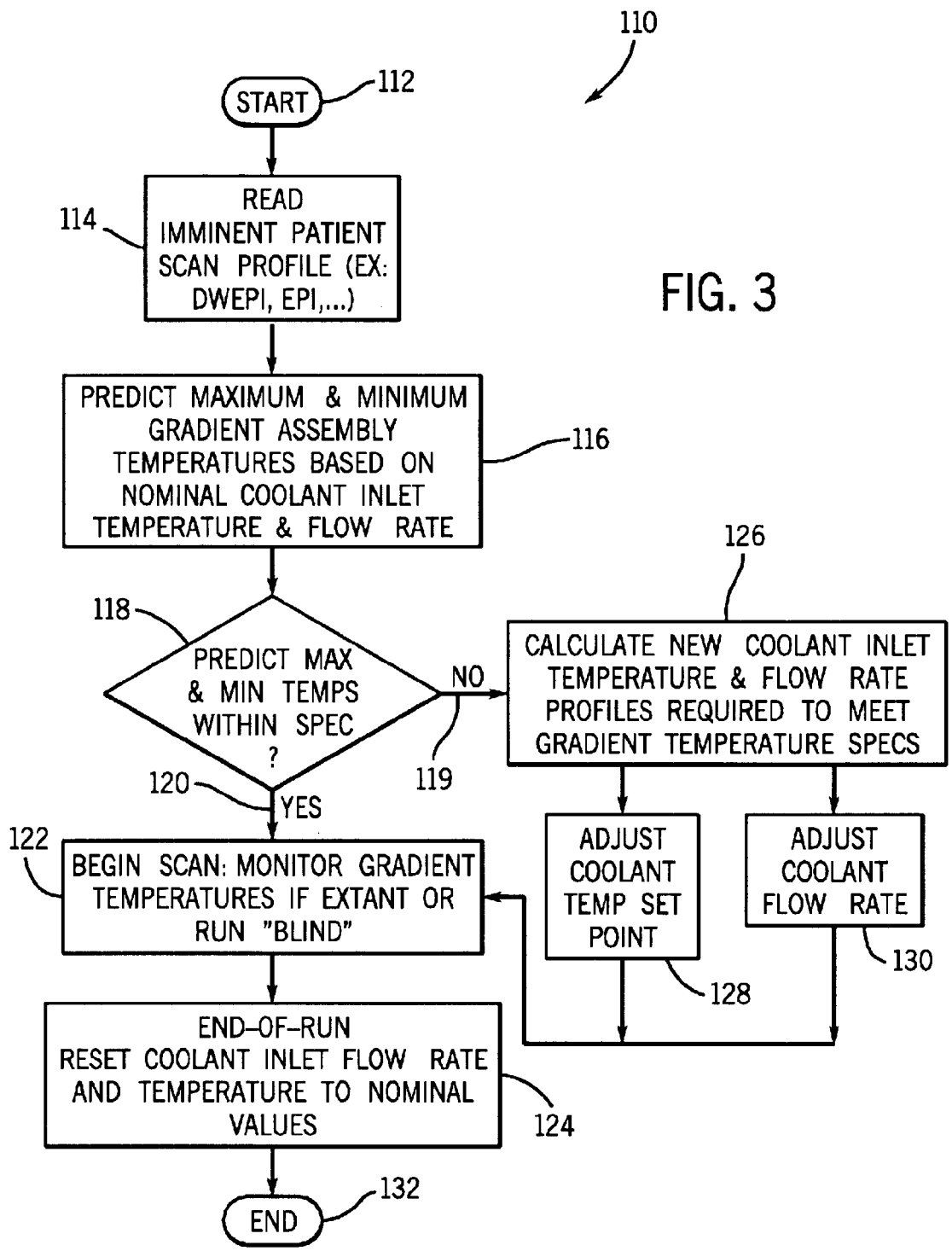
FIG. 3 is a flow chart illustrating the steps of a thermal control technique for use with the present invention.

Referring to FIG. 3, an algorithm 110 is provided to dynamically regulate coolant temperature for dissipating heat generated by a selected gradient coil. Algorithm 110 begins at 112 with a reading of a desired scan profile at 114. The anticipated scan profile, duration, and power requirements are typically known and selected in advance of each scan and are read at 14 as inputs from an operator. At 116, preferably, maximum and minimum gradient assembly temperatures are predicted based on a nominal cooling inlet temperature and flow rate. In doing so, the present invention determines the gradient thermal load and predicts the optimal temperature range limits that would in turn effect the temperature within the resonance module as well as on the patient surfaces and warm bore surface. After the temperature range is determined at 116, the system predicts whether these maximum and minimum temperatures will fall within a specific specification range at 118. If the temperatures fall within the specification range 118, 120, an imaging scan can proceed at 122. Conversely, if the predicted maximum and minimum temperatures fall outside the specification requirements 118, 119, the present invention determines a new coolant inlet temperature and flow rate profile required to meet the gradient temperature specifications at 126.

Once the new coolant inlet temperature and flow rate are determined at 126, the coolant temperature is adjusted by the chiller or heat exchanger 96, FIG. 2, at 128 and/or the coolant flow rate can be adjusted by the coolant pump 86, FIG. 2, at 130. Once the coolant temperature and/or flow rate are adjusted 128, 130, a scanning session begins at 122. Although the coolant temperature and/or flow rate can be adjusted to maintain a maximum and minimum temperature within a specified range, the predictive control process of the present invention is configured to continually monitor the critical temperatures so that further adjustments to the coolant temperature and/or flow rate may be made to maintain the temperature range within specified requirements. After the scan is complete at 122, the coolant inlet flow rate and/or coolant temperatures are reset to default values at 124 wherein the predictive control process ends at 132.

In accordance with one embodiment of the present invention, a method for cooling electrical coils in MRI device is provided. The method includes the step of determining a future thermal load for an electrical coil based on a desired use of the electrical coil and determining an expected operating temperature range for the coil based on the gradient thermal load. The expected operating temperature range is then compared to a device specification temperature range. If necessary, based the comparison of the expected operating temperature range to the specification temperature range, cooling operating parameters are adjusted to drive the expected operating temperature range to be within the specification temperature range.

In another embodiment of the present invention, a computer program is provided to maintain critical temperatures of an MRI system within acceptable limits. The computer program includes a set of instructions that when executed by a computer causes the computer to receive an imminent scan profile and predict a gradient thermal load required for the imminent scan profile. The set of instructions also causes the computer to determine a cooling profile to accommodate the gradient thermal load and to cool the MRI system according to the cooling profile.

In yet a further embodiment of the present invention, an MRI apparatus is provided and includes a magnetic resonance imaging (MRI) system having a plurality of gradient coils. The gradient coils are configured to be positioned about a bore of a magnet to impress a polarizing magnetic field. The MRI system further includes an RF transceiver system and an RF switch controlled by a pulse module to transmit RF signals to an RF coil assembly to acquire MR images. The MRI apparatus also includes an input device to receive a selected scan and a cooling system to dissipate heat from the plurality of gradient coils. The cooling system includes a temperature sensor positioned to sense gradient coil temperature and a set of coolant tubes having a coolant pass therethrough and in thermal contact to transfer heat from the gradient coils of the MR system. A heat exchanger is connected to the coolant tubes to remove heat from the coolant. A control is connected to receive signals from the temperature sensor and the input device and proactively control coolant temperature in response to selected scan sequence.

In accordance with another aspect of the present invention, a predictive thermal control of an imaging device is provided. An input to receive a user selected scan sequence is included, along with at least one temperature sensor positioned to sense gradient coil temperature of a gradient coil assembly of an imaging device. The control further includes a pressure sensor positioned to sense pressure of a vacuum enclosure housing the gradient coil assembly therein. A humidity sensor is also provided and positioned to sense relative humidity within the vacuum enclosure. The aforementioned sensors continuously provide feedback to a processor programmed to maintain device-operating temperatures within a specification range. The processor is further programmed to determine a cooling profile based on the selected sequence and, in response to the feedback, adjust the default coolant profile on-the-fly to regulate proper cooling of the gradient coil assembly.

The present invention has been described in terms of the preferred embodiment, and it is recognized that equivalents, alternatives, and modifications, aside from those expressly stated, are possible and within the scope of the appending claims.

What is claimed is:

1. A method of cooling electrical coils comprising the steps of:
   determining a future-thermal load on an electrical coil based on a desired use of the electrical coil;
   determining an expected operating temperature range;
   comparing the expected operating temperature range to a specification temperature range; and
   if necessary, adjusting coolant operating parameters to drive the expected operating temperature range to be within the specification temperature range.

2. The method of claim 1 further comprising the step of adjusting a default coolant profile based on the future thermal load.

3. The method of claim 2 further comprising the step of determining an adjusted coolant profile if the expected operating temperature range is outside the specification temperature range.

4. The method of claim 2 further comprising the step of resetting the adjusted coolant profile to the default coolant profile after completion of the desired use.

5. The method of claim 1 wherein the coolant operating parameters include at least one of a coolant inlet temperature and a coolant flow rate.

6. The method of claim 1 wherein the electrical coils are gradient coils of an MR device and further comprises the step of lowering coolant temperature below an ambient dew point to allow higher power levels to the gradient coils.

7. The method of claim 6 wherein the expected operating temperature range includes a maximum temperature and a minimum temperature for at least one of a resonance module, a patient bore surface, and a warm bore surface.

8. The method of claim 6 further comprising the step of initializing an imaging session and further comprising the step of monitoring an operating temperature during the imaging session and adjusting the coolant operating parameters to maintain an actual operating temperature within the specification temperature range.

9. A computer program to maintain critical temperatures of an MRI system within acceptable limits having a set of instructions that when executed by a computer causes the computer to:
   receive an imminent scan profile;
   predict a gradient thermal load for the imminent scan profile;
   determine a cooling profile to accommodate the gradient thermal load; and
   cool the MRI system according to the cooling profile.

10. The computer program of claim 9 wherein the set of instructions further causes the computer to:
    determine a preferred maximum and minimum temperature at a number of locations of an MRI system;
    predict a maximum operating temperature for the number of locations of the MRI system based on the cooling profile;
    compare the predicted maximum operating temperature of the locations to the preferred maximum and minimum temperatures;
    regulate the cooling profile to adjust the predicted maximum temperature to be within the preferred maximum and minimum temperatures; and
    initialize a scanning session wherein a liquid coolant circulates through the MRI system consistent with the cooling profile.

11. The computer program of claim 10 wherein the set of instructions further causes the computer to continuously monitor actual operating temperatures at the number of locations of the MRI apparatus and adjust the cooling profile in response to fluctuations in the actual operating temperatures.

12. The computer program of claim 10 wherein the number of locations include a patient bore surface, a warm bore surface, and a resonance module.

13. The computer program of claim 9 wherein the cooling profile includes at least one of a coolant inlet temperature and a coolant flow rate.

14. The computer program of claim 9 wherein the set of instructions further causes the computer to drive liquid coolant temperature below an atmospheric dew point temperature to permit scanning sequences with higher power requirements and increased scanning time.

15. The computer program of claim 9 wherein the set of instructions further causes the computer to maintain gradient coil temperature independent of variations in power supplied to a gradient coil assembly of the MRI apparatus.

16. An MRI apparatus comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
an input device to select a scan sequence; and
a cooling system having:
   a temperature sensor positioned to sense an indication of gradient coil temperature;
   a set of coolant tubes having a coolant pass therethrough and in thermal contact to transfer heat from the gradient coils of the MR system;
   a heat exchanger connected to the coolant tubes to remove heat from the coolant; and
   a control connected to receive signals from the temperature sensor and the input device to proactively control coolant temperature in response to the selected scan sequence.

17. The MRI apparatus of claim 16 wherein the cooling system also includes a coolant flow control valve in fluid communication with the set of coolant tubes and wherein the control is also connected to send signals to the coolant flow control valve to regulate coolant flow rate.

18. The MRI apparatus of claim 16 further comprising a computer connected to the control and having a set of instructions stored on a computer readable storage medium thereof that when executed by the computer causes the computer to:
recall a default coolant profile;
determine operating requirements of an impending scanning session defined by the selected scan sequence;
determine a thermal load of the MRI system from the operating requirements of the impending scanning session;
predict an operating temperature range from the default coolant profile and the determined thermal load;
compare the predicted operating temperature range to a threshold temperature range; and
if necessary, adjust the default coolant profile such that the predicted operating temperature is adjusted to satisfy the threshold temperature range.

19. The MRI apparatus of claim 18 wherein the set of instructions further causes the computer to adjust the coolant temperature in accordance with the adjusted coolant profile.

20. The MRI apparatus of claim 16 wherein the set of instructions further causes the control to continuously monitor operating parameters of the MRI system during an imaging scan and adjust the coolant temperature in response thereto.

21. The MRI apparatus of claim 16 further comprising:
a vacuum chamber enclosing the coolant tubes;
a vacuum pump connected to the vacuum chamber; and
at least one pressure sensor connected to sense pressure within the vacuum chamber.

22. The MRI apparatus of claim 16 further comprising a humidity sensor positioned to sense humidity in the vacuum chamber and connected to the control to limit power to the gradient coils if the sensed humidity in the vacuum chamber exceeds a predetermined level.

23. The MRI apparatus of claim 16 further comprising a first temperature sensor in thermal contact with a patient bore surface of the MRI system, a second temperature sensor in thermal contact with a resonance module, and a third temperature sensor in thermal contact with an outer bore surface.

24. The MRI apparatus of claim 16 comprising a feedback loop to lower coolant temperature in response to an increase in gradient coil temperature wherein the feedback loop and the control maintain the gradient coil temperature regardless of variations in power to the gradient coils.

25. A predictive thermal control for cooling electrical coils of an imaging device comprising:
an input to receive a user selected scan sequence;
at least one temperature sensor positioned to sense an indication of gradient coil temperature of a gradient coil assembly of an imaging device;
a pressure sensor positioned to sense pressure of a vacuum enclosure housing the gradient coil assembly therein;
a humidity sensor positioned to sense a relative humidity within the vacuum enclosure;
wherein each sensor continuously provides feedback to a processor programmed to;
determine a default cooling profile based on the user selected scan sequence; and
adjust the cooling profile on-the-fly in response to the feedback to maintain device operating temperature within a temperature specification range.

26. The control of claim 25 wherein the processor is connected to a heat exchanger configured to dissipate heat from a liquid coolant, and wherein the processor is further programmed to transmit a signal to control the heat and adjust coolant temperature, and when necessary, to lower coolant temperature below an ambient dew point.

27. The control of claim 25 wherein the processor is further programmed to provide power levels to the gradient coil assembly consistent with lowering the coolant temperatures below the ambient dew point.

28. The control of claim 25 wherein the processor is further programmed to:
determine a preferred maximum and minimum temperature for a number of internal structures of the imaging device, wherein the number of internal structures include a resonance module having therein a gradient coil assembly, a patient bore surface, and a warm bore surface;
determine a gradient thermal load for a planned scan;
determine operating parameters for the cooling profile based on the gradient thermal load; and
continuously regulate the cooling profile to maintain actual temperatures of the number of internal structures to be within the preferred maximum and minimum temperatures.

29. The control of claim 25 wherein the imaging device includes an MRI device and wherein the processor is further programmed to reset the default cooling profile upon completion of an imaging session to a default profile.

* * * * *

UNITED STATES PATENT AND TRADEMARK OFFICE
CERTIFICATE OF CORRECTION

PATENT NO.   : 6,516,282 B2
DATED        : February 4, 2003
INVENTOR(S)  : Hedlund et al.

It is certified that error appears in the above-identified patent and that said Letters Patent is hereby corrected as shown below:

<u>Title page,</u>
Item [57], ABSTRACT,
Line 6, delete "faster-imaging" and substitute therefor -- faster imaging --;

<u>Column 9,</u>
Line 60, delete "future-thermal" and substitute therefor -- future thermal --;

Signed and Sealed this

Seventeenth Day of June, 2003

JAMES E. ROGAN
*Director of the United States Patent and Trademark Office*